(12) United States Patent (10) Patent No.: US 7,872,294 B2
Nakanishi (45) Date of Patent: Jan. 18, 2011

(54) SEMICONDUCTOR DEVICE HAVING A CAPACITANCE ELEMENT AND METHOD OF MANUFACTURING THE SAME

(75) Inventor: Naruhiko Nakanishi, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/698,417

(22) Filed: Feb. 2, 2010

(65) Prior Publication Data

US 2010/0133655 A1 Jun. 3, 2010

Related U.S. Application Data

(62) Division of application No. 11/923,062, filed on Oct. 24, 2007, now Pat. No. 7,691,743.

(30) Foreign Application Priority Data

Oct. 26, 2006 (JP) ............................. 2006-290673
Oct. 9, 2007 (JP) ............................. 2007-263138

(51) Int. Cl.
*H01L 31/119* (2006.01)
*H01L 21/44* (2006.01)

(52) U.S. Cl. ...................................... 257/310; 438/660

(58) Field of Classification Search ...................... 438/3, 438/660, 250, 393; 257/295, 310
See application file for complete search history.

(56) References Cited

U.S. PATENT DOCUMENTS 5,978,207 A 11/1999 Anderson et al.

| | | | |
|---|---|---|---|
| 6,143,597 A | 11/2000 | Matsuda et al. | |
| 6,190,924 B1 * | 2/2001 | Lee | 438/3 |
| 6,323,057 B1 | 11/2001 | Sone | |
| 6,882,516 B2 * | 4/2005 | Baniecki et al. | 361/321.1 |
| 7,691,743 B2 * | 4/2010 | Nakanishi | 438/660 |

FOREIGN PATENT DOCUMENTS

| JP | 7-249616 A | 9/1995 |
|---|---|---|
| JP | 9-17949 A | 1/1997 |
| JP | 09-202606 A | 8/1997 |
| JP | 2003-282717 A | 10/2003 |
| JP | 2004-146559 A | 5/2004 |
| JP | 2005-191293 A | 7/2005 |
| JP | 2005-217409 A | 11/2005 |
| JP | 2006-060174 A | 3/2006 |

* cited by examiner

*Primary Examiner*—Calvin Lee
(74) *Attorney, Agent, or Firm*—Sughrue Mion, PLLC

(57) ABSTRACT

A dielectric film is formed by depositing an amorphous strontium oxide film to a thickness of one to several atomic layers on a first electrode layer, then depositing an amorphous titanium oxide film to a thickness of one to several atomic layers on the amorphous strontium oxide film, and then heat-treating a laminated film of the amorphous strontium oxide film and the amorphous titanium oxide film at a temperature close to a crystallization start temperature, thereby converting the laminated film to a single-layer amorphous strontium titanate film containing a plurality of crystal grains therein. The laminated film may have a plurality of amorphous strontium oxide films and a plurality of amorphous titanium oxide films that are alternately laminated. A semiconductor device includes a capacitor having as its dielectric film a single-layer amorphous strontium titanate film containing a plurality of crystal grains therein.

8 Claims, 8 Drawing Sheets

FIG. 1

SEMICONDUCTOR DEVICE HAVING A CAPACITANCE ELEMENT AND METHOD OF MANUFACTURING THE SAME

This application is a Divisional Application of U.S. patent application Ser. No. 11/923,062 filed Oct. 24, 2007, which claims priority to Japanese Patent Application No. 2006-290673 filed on Oct. 26, 2006, and Japanese patent application No. 2007-263138 filed on Oct. 9, 2007, the disclosures of which are incorporated herein in their entirety by reference.

BACKGROUND OF THE INVENTION

1. Field of the Invention

This invention relates to a method of forming a dielectric film suitable for applying to a semiconductor device having a capacitance element. More specifically, this invention relates to a capacitance element and a semiconductor device each using a dielectric film and further relates to methods of manufacturing them.

2. Description of the Related Art

Recent semiconductor devices have significantly increased in capacity and, in the DRAM (Dynamic Random Access Memory) field, large-capacity memories of 1 Gbit have been put to practical use. DRAM cells each normally comprise one transistor and one capacitor. Charges representing information are stored into the capacitors through the transistors or information in the form of charges stored in the capacitors is read through the transistors. Each capacitor comprises two electrodes, i.e. a lower electrode connected to a diffusion layer electrode of the transistor and an upper electrode commonly connected to a reference potential, and further comprises a capacitor dielectric film disposed between those electrodes.

In the large-capacity memory, following the reduction in size of memory cells, the occupation area of a capacitor portion is also reduced in each memory cell. However, in the memory such as the DRAM, since charges in the capacitors are used as stored information, each capacitor is required to have a capacitance greater than a certain value in order to ensure the stable memory operation. For achieving the capacitance greater than the certain value in the reduced memory-cell area, it is necessary to reduce the thickness of a capacitor dielectric film or to use a high-permittivity material as a capacitor dielectric film. For example, in the current state, a film thickness of 1 nm or less is required in terms of a silicon oxide ($SiO_2$) film. For this purpose, practical use is made of a dielectric film, such as an $AlO_x$ (aluminum oxide; relative permittivity: about 9) film or a $Ta_2O_5$ (tantalum pentoxide; relative permittivity: about 50) film, having a higher permittivity than a $SiO_2$ (silicon oxide) film and a $Si_3N_4$ (silicon nitride) film which have hitherto been used. Further, practical use of a strontium titanate (hereinafter also referred to as "STO") film having a relative permittivity exceeding 100 is also now under review.

For example, in Patent Document 1 (Japanese Unexamined Patent Application Publication (JP-A) No. 2004-146559), polycrystalline ruthenium is used as a lower electrode of a capacitor and, as a dielectric film thereof, an amorphous strontium titanate film is formed by chemical vapor deposition (CVD) and then is crystallized into a single-crystal strontium titanate film by a heat treatment.

There is a problem that although a crystalline strontium titanate film exhibits a high relative permittivity, it cannot be practically used because of its large leakage current along crystal grain boundaries.

As a countermeasure therefor, there is proposed a technique using a composite structure of a polycrystalline STO film and an amorphous STO film as a dielectric film, for example, in Patent Document 2 (Japanese Unexamined Patent Application Publication (JP-A) No. 2003-282717) or Patent Document 3 (Japanese Unexamined Patent Application Publication (JP-A) No. Hei 09-202606).

SUMMARY OF THE INVENTION

However, it is generally difficult to stably control and form a laminated structure of a crystalline layer and an amorphous layer of the same composition. For example, crystallization of the amorphous layer proceeds due to high temperature in forming the crystalline layer on the amorphous layer, so that a desired film structure is difficult to obtain.

Further, the relative permittivity of a strontium titanate film depends on its composition, but it is difficult to form a desired film having a uniform composition. This is because, in vapor deposition of a film containing three elements such as titanium, strontium, and oxygen, it is generally far more difficult to control chemical reactions than in two-element vapor deposition and, for example, a phenomenon is observed in which the composition changes in the thickness direction as the film formation proceeds. Therefore, a capacitance element using a dielectric film manufactured by those methods has a difficulty in realizing the desired characteristics.

It is therefore an object of this invention to provide a method of manufacturing a semiconductor device having a capacitance element using a three-element dielectric film with a desired composition which is formed using a two-element film forming technique.

It is another object of this invention to provide a method of manufacturing a semiconductor device using a dielectric film with a small leakage current and a high relative permittivity.

It is still another object of this invention to provide a semiconductor device using a dielectric film suitable for an increase in memory capacity.

In the case where a strontium titanate film containing three elements, i.e. titanium, strontium, and oxygen, is used as a dielectric film of a capacitance element of a semiconductor device, titanium oxide films and strontium oxide films, i.e. two-element films, are alternately laminated at a temperature, for example, at 400° C., in which crystallization does not occur, to thereby form a laminated film in which the titanium oxide films and the strontium oxide films each preferably has a thickness of about several atomic layers. Then, by heat-treating the laminated film at a temperature close to a crystallization start temperature determined by the titanium, strontium, and oxygen composition of the entire laminated film, it is possible to obtain a single-layer amorphous strontium titanate film having a uniform composition and covering a plurality of crystal grains on the inside thereof.

In the single-layer amorphous strontium titanate film thus obtained, the boundaries between the layers in the laminated film disappear and, since a plurality of crystal grains are locally grown, the crystal grains are included in the amorphous film. It is considered that this phenomenon takes place due to rearrangement of atoms.

According to a first aspect of this invention, there is obtained a method of manufacturing a semiconductor device having a capacitance element including a dielectric film disposed between a first electrode layer and a second electrode layer. Formation of the capacitance element comprises a step of forming a laminated film comprising at least one pair of amorphous films on the first electrode layer, the amorphous films being a first two-element amorphous metal oxide film and a second two-element amorphous metal oxide film formed in the order named or in the reverse order, and a step of heat-treating the laminated film at a temperature close to a crystallization start temperature, thereby converting the laminated film to a single-layer three-element amorphous metal oxide film covering a plurality of crystal grains therein.

Preferably, the first two-element amorphous metal oxide film and the second two-element amorphous metal oxide film are each deposited to a thickness of one to ten atomic layers. More preferably, the first two-element amorphous metal oxide film and the second two-element amorphous metal oxide film are each deposited to a thickness of one to several atomic layers.

Preferably, the first two-element amorphous metal oxide film is a strontium oxide film and the second two-element amorphous metal oxide film is a titanium oxide film.

Preferably, the three-element amorphous metal oxide film is a strontium titanate film.

Preferably, the molar ratio of strontium to titanium in the strontium titanate film is 0.8 to 1.2. More preferably, the molar ratio of strontium to titanium in the strontium titanate film is 0.8 to 1.0.

The formation of the capacitance element may further comprise a step of forming an aluminum oxide film between the first two-element amorphous metal oxide film and the first electrode layer or between the second electrode layer and the second two-element amorphous metal oxide film.

According to another aspect of this invention, there is obtained a method of manufacturing a semiconductor device having a capacitance element including a dielectric film disposed between a first electrode layer and a second electrode layer, wherein the method comprises a step of forming a laminated film comprising at least one pair of amorphous films on the first electrode layer, the amorphous films being an amorphous strontium oxide film having a thickness of one to ten atomic layers and an amorphous titanium oxide film having a thickness of one to ten atomic layers, which are formed in the order named or in the reverse order, and a step of heat-treating the laminated film at a temperature close to a crystallization start temperature, thereby converting the laminated film to a single-layer amorphous strontium titanate film containing a plurality of crystal grains therein.

The method may further comprise a step of forming an aluminum oxide dielectric film between the first electrode layer and the amorphous strontium oxide film or between the second electrode layer and the amorphous titanium oxide film before forming the amorphous strontium oxide film or after forming the amorphous titanium oxide film.

According to still another aspect of this invention, there is obtained a semiconductor device having a capacitance element including a dielectric film disposed between a first electrode layer and a second electrode layer, wherein the dielectric film comprises a single-layer amorphous strontium titanate film covering a plurality of crystal grains.

Preferably, the molar ratio of strontium to titanium in the amorphous strontium titanate film is 0.8 to 1.2. More preferably, the molar ratio of strontium to titanium in the amorphous strontium titanate film is 0.8 to 1.0.

Preferably, the amorphous strontium titanate film is a dielectric film formed by heat-treating a laminated film comprising at least one pair of amorphous films at a temperature close to a crystallization start temperature of strontium titanate, the amorphous films being an amorphous strontium oxide film having a thickness of one to ten atomic layers and an amorphous titanium oxide film having a thickness of one to ten atomic layers, which are formed on the first electrode layer in the order named or in the reverse order.

The semiconductor device may further comprise an aluminum oxide dielectric film between one of the first and second electrode layers and the amorphous strontium titanate film.

According to a further aspect of this invention, there is obtained a capacitance element including a dielectric film disposed between a first electrode layer and a second electrode layer, wherein the dielectric film comprises a single-layer amorphous strontium titanate film covering a plurality of crystal grains.

In this invention, since a three-element film having a desired uniform composition is formed using the two-element film forming technique, it is possible to obtain a dielectric film with a uniform composition.

By forming a strontium oxide film and a titanium oxide film as two-element amorphous films and then heat-treating a laminated film of them at a temperature close to a crystallization start temperature, it is possible to form a single-layer amorphous strontium titanate film with a stable and high relative permittivity in which a plurality of crystal grains are mixed.

Since the relative permittivity of a crystalline layer is higher than that of an amorphous layer, it is possible to improve the effective relative permittivity of the entire film by increasing the ratio of the crystalline portion to the amorphous portion through the heat treatment. Further, it is possible to suppress an increase in leakage current by reducing the probability that the crystal grain boundaries are connected between electrodes of a capacitance element to form a path for leakage current of the capacitance element.

DESCRIPTION OF THE PREFERRED EMBODIMENTS

Exemplary embodiments of this invention will be described with reference to the drawings.

Figure 1:
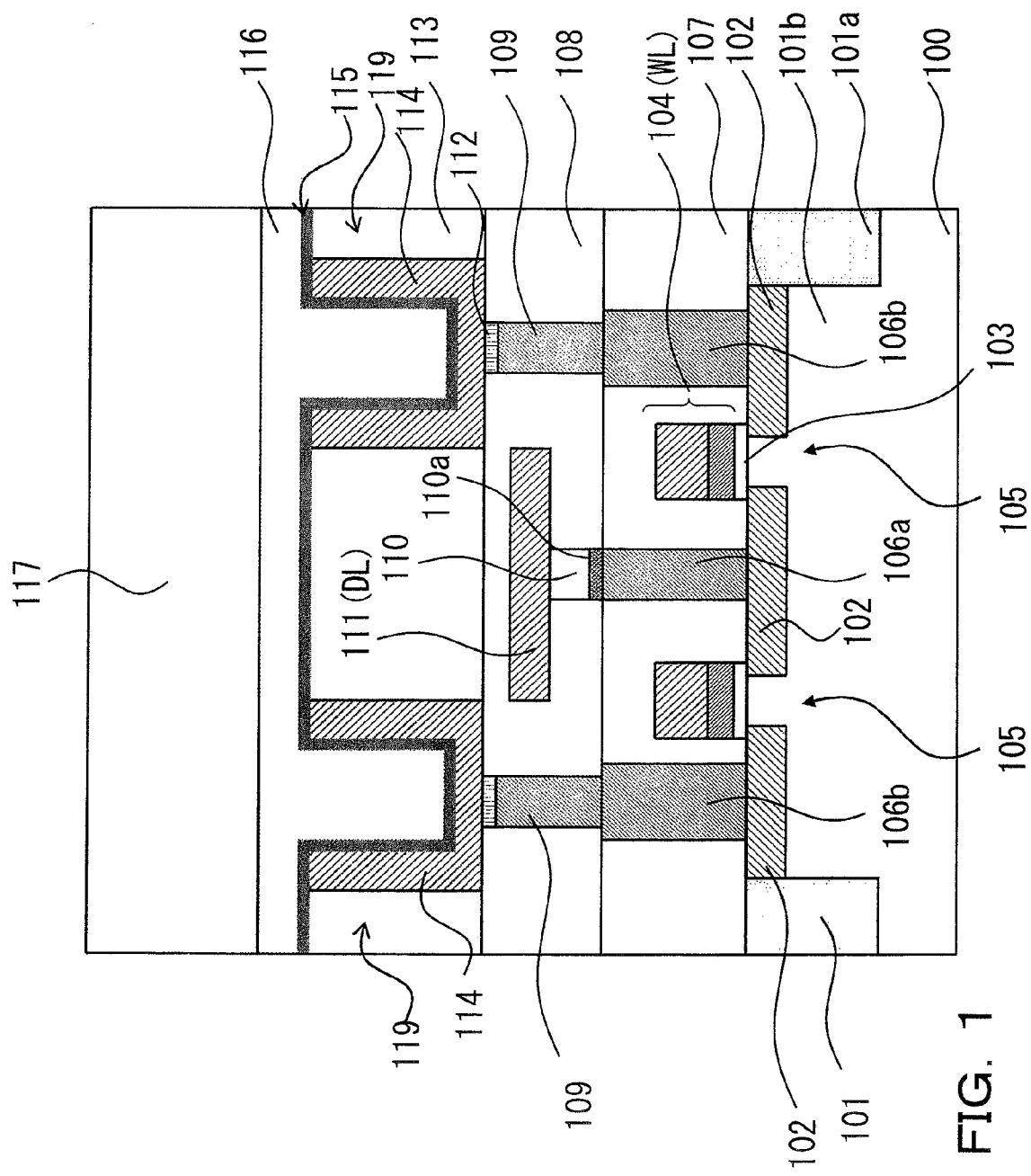
FIG. 1 is a sectional view of memory cells of a DRAM, i.e. a semiconductor device, according to a first exemplary embodiment of this invention.
Figure 2:
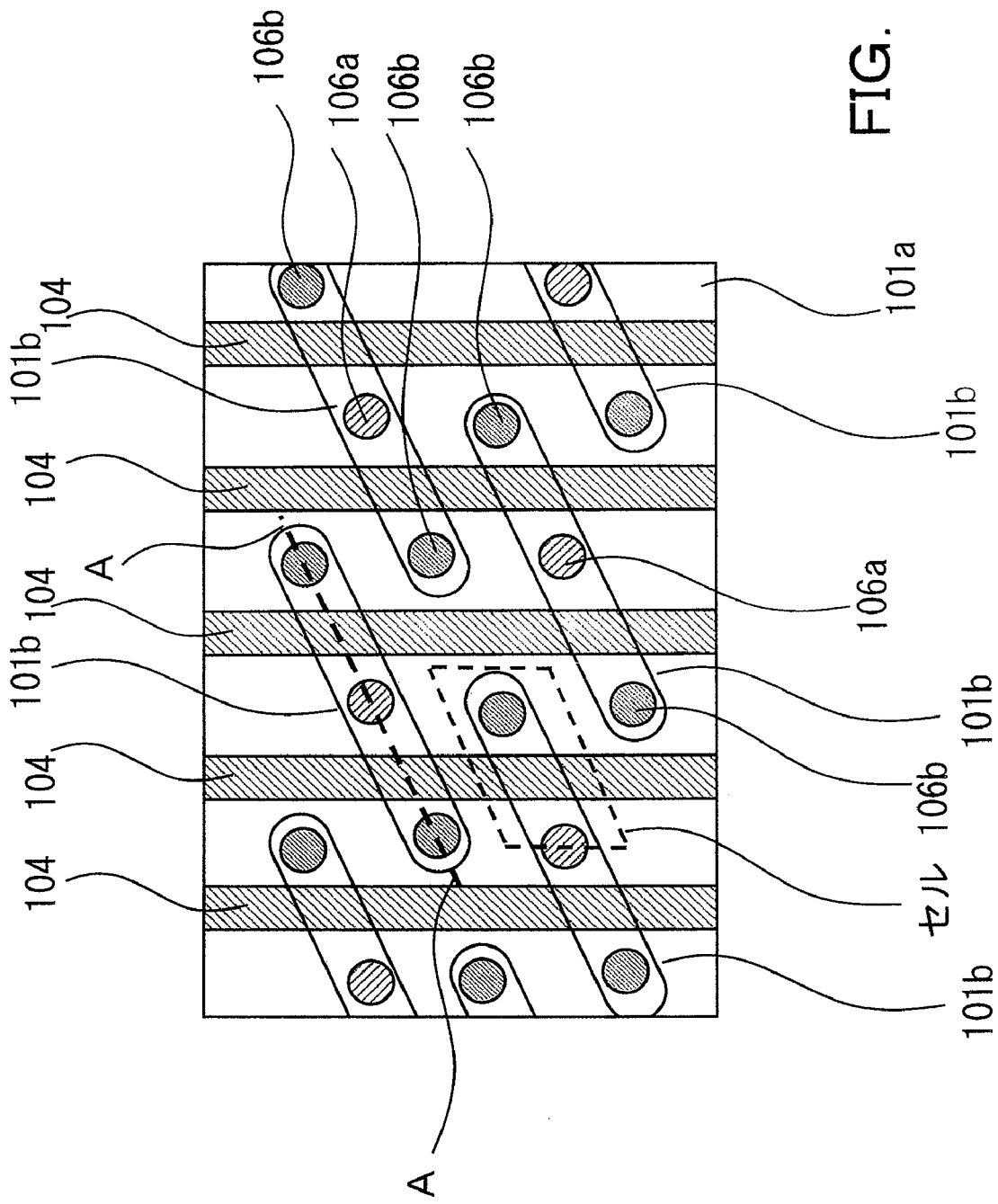
FIG. 2 is a plan view of memory cells of the semiconductor device according to the first exemplary embodiment.

FIGS. 1 and 2 are a sectional view and a plan view, respectively, of a memory cell portion of a DRAM as a first exemplary embodiment of a semiconductor device applied with this invention. FIG. 1 shows a section taken along line A-A' in FIG. 2.

In FIG. 2, insular active regions 101b surrounded by an element isolation trench region 101a are each formed with two DRAM cells (two bits) each comprising one transistor and one capacitor. Referring to FIG. 1 together with FIG. 2, those portions where word lines 104 cross the insular active regions 101b operate as transistors 105 (FIG. 1), respectively. One of source/drain regions 102 of each transistor is connected to a bit line 111 through a bit-line contact (polycrystalline silicon contact) 106a and a bit-line contact plug 110. The other thereof is connected through a capacitor contact (polycrystalline silicon contact) 106b and a capacitor contact plug 109 to a capacitor 119 comprising a capacitor lower electrode 114, a capacitor dielectric film 115 which will be described in detail later, and a capacitor upper electrode 116. Further, an insulating film 117 is formed over the upper electrode 116.

Now, a method of manufacturing the foregoing semiconductor device will be described. The following description will generally refer to one of the active regions 101b for the sake of brevity, but it is readily understood that all the active regions 101b are simultaneously subjected to the same processing.

Figure 3:
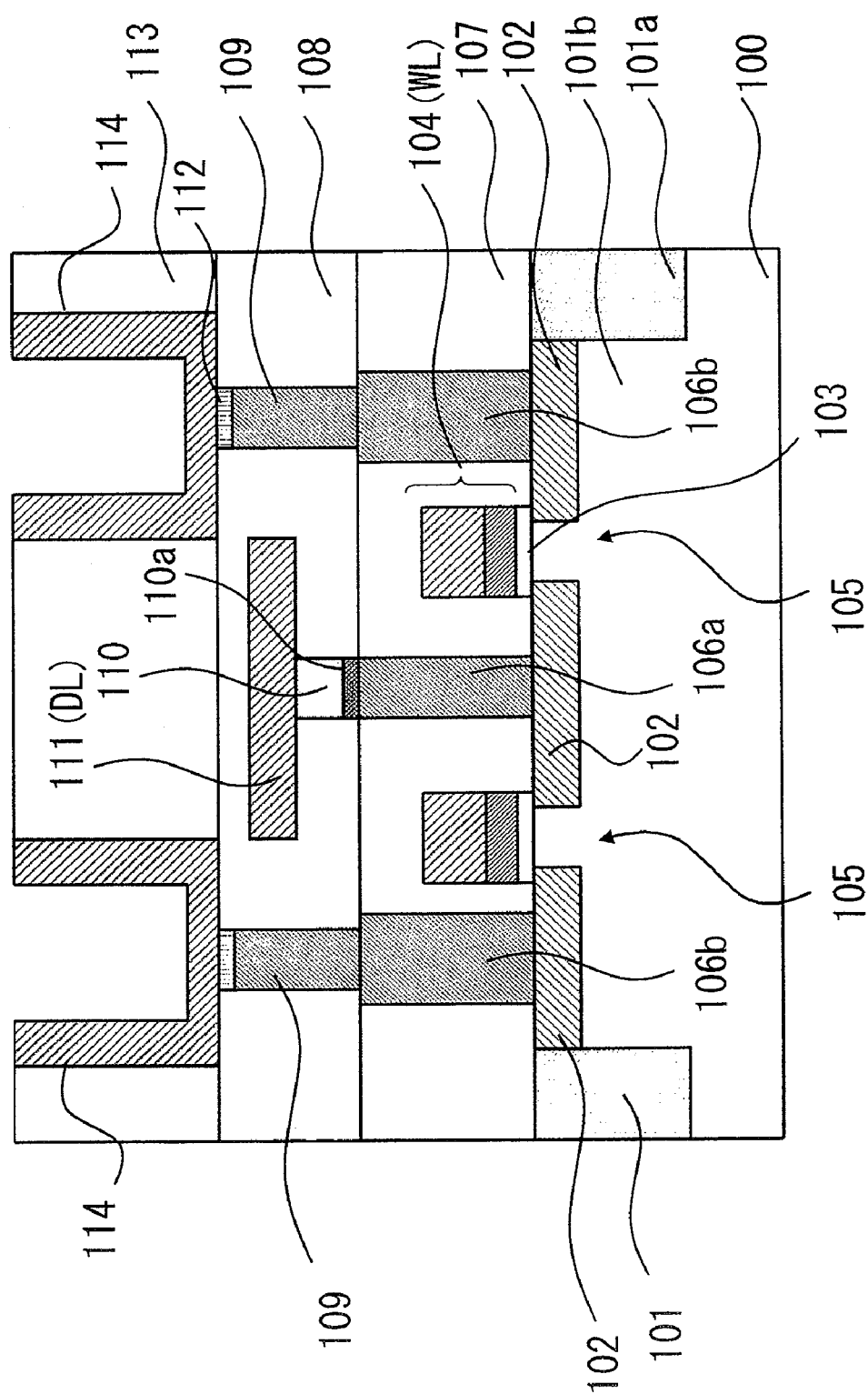
FIG. 3 is a sectional view for explaining one of manufacturing processes of the semiconductor device according to the first exemplary embodiment.
Figure 4:
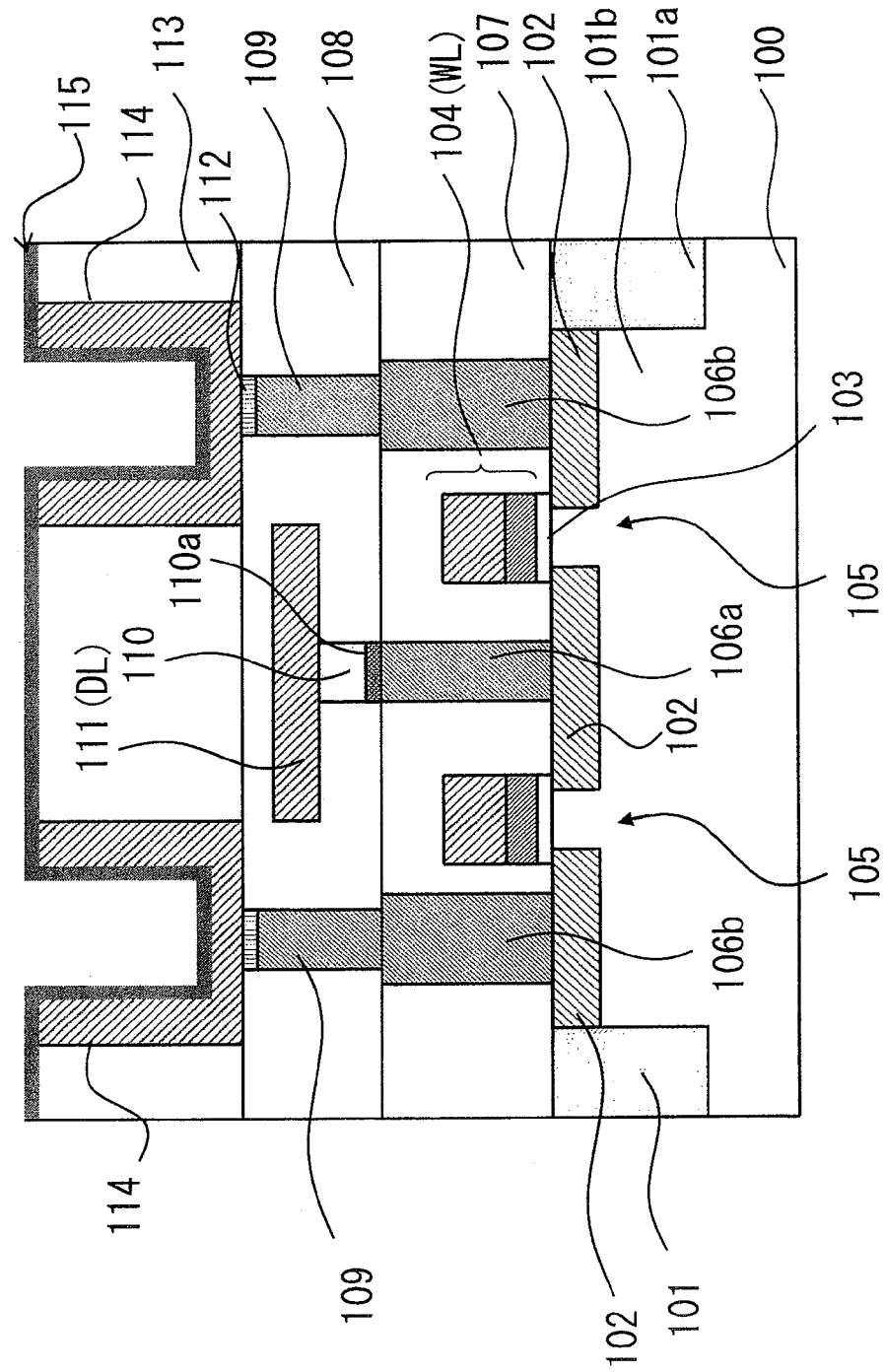
FIG. 4 is a sectional view for explaining a manufacturing process subsequent to the manufacturing process shown in FIG. 3.

FIGS. 3 and 4 are sectional views each showing part of the manufacturing processes of the semiconductor device, i.e. the DRAM, shown in FIGS. 1 and 2.

An element isolation trench region 101a is formed on the main surface of a p-type silicon substrate 100 having a resistivity of about 10 Ωcm. The element isolation trench region 101a is obtained by forming a silicon oxide film and a silicon nitride film into a predetermined pattern on the main surface of the silicon substrate 100, then dry-etching the silicon substrate 100 using the silicon nitride film as a mask to form a trench having a depth of about 300 to 400 nm and surrounding active regions 101b, and then burying a silicon oxide film in the trench.

P-type and n-type well regions (not shown) are formed in the silicon substrate 100 in each active region 101b surrounded by the element isolation trench region 101a. Then, gate electrodes 104 are formed on a silicon oxynitride film (gate insulating film) 103 having a thickness of about 3 to 6 nm and formed in transistor gate forming regions. The gate electrode 104 is in the form of a laminated film of a polycrystalline silicon layer containing an impurity, a barrier metal layer (not shown), and a tungsten layer.

N-type source/drain regions 102 of n-type MOS transistors 105 are formed by ion-implanting an n-type impurity into the silicon substrate 100 at its main surface in each active region 101b using the element isolation trench region 101a and the gate electrodes 104 as a mask. An insulating layer (inter-layer insulation film) 107 is formed, for example, by depositing a silicon oxide film by CVD, then a bit-line contact hole and capacitor contact holes are formed in the insulating layer 107 in each active region 101b, and then polycrystalline silicon is buried in these contact holes, thereby forming polycrystalline silicon contacts 106a and 106b. More specifically, the polycrystalline silicon contacts 106a and 106b are formed by depositing a polycrystalline silicon film containing an n-type impurity by CVD and then polishing the polycrystalline silicon film by CMP (Chemical Mechanical Polishing) to cause it to remain only in the contact holes. After the deposition of a silicon oxide film, a contact opening is formed over the bit-line contact 106a, then titanium and titanium nitride are deposited in order by sputtering to form a barrier metal layer 110a, and then tungsten is deposited by CVD and polished by CMP, thereby forming a bit-line contact plug 110. In this event, a titanium silicide layer is formed due to a heat treatment at the interface between the barrier metal layer 110a and the polycrystalline silicon contact 106a.

Tungsten is further deposited and patterned into bit lines 111. Then, after depositing a silicon oxide film as an insulating layer 108, an opening is formed over each capacitor contact 106b and polycrystalline silicon containing an n-type impurity is buried in the opening, thereby forming a capacitor contact plug 109. In this event, an upper portion of the capacitor contact plug 109 is excessively removed by etching to form a recess and a ruthenium silicide film is deposited and polished by CMP, thereby forming a barrier metal layer 112. It is also possible to use a method of depositing ruthenium and then applying a heat treatment to cause a chemical reaction, thereby forming a ruthenium silicide film.

Then, a silicon oxide film is deposited as an insulating layer 113 by CVD. In this event, a silicon nitride film (not shown) may be deposited under the silicon oxide film so as to serve as an etching stopper when forming openings in the insulating layer 113 for forming capacitor lower electrodes 114. After forming, by dry etching, the openings in the insulating layer 113 for forming the capacitor lower electrodes 114, a ruthenium film is formed by CVD. Then, after burying an insulating film in holes over the ruthenium film in the openings, the ruthenium film other than the capacitor lower electrodes 114 in the openings is removed by etchback or CMP, thereby forming the hollow-cylindrical capacitor lower electrodes 114, and then the insulating film buried in the holes is removed by wet etching. In this manner, the structure shown in FIG. 3 is obtained.

Then, a strontium titanate film is formed as a capacitor dielectric film 115 on an upper surface of the structure of FIG. 3, thereby obtaining the structure shown in FIG. 4.

The processes of forming the capacitor dielectric film 115 will be described in detail with reference to FIGS. 5 and 7.

Figure 5:
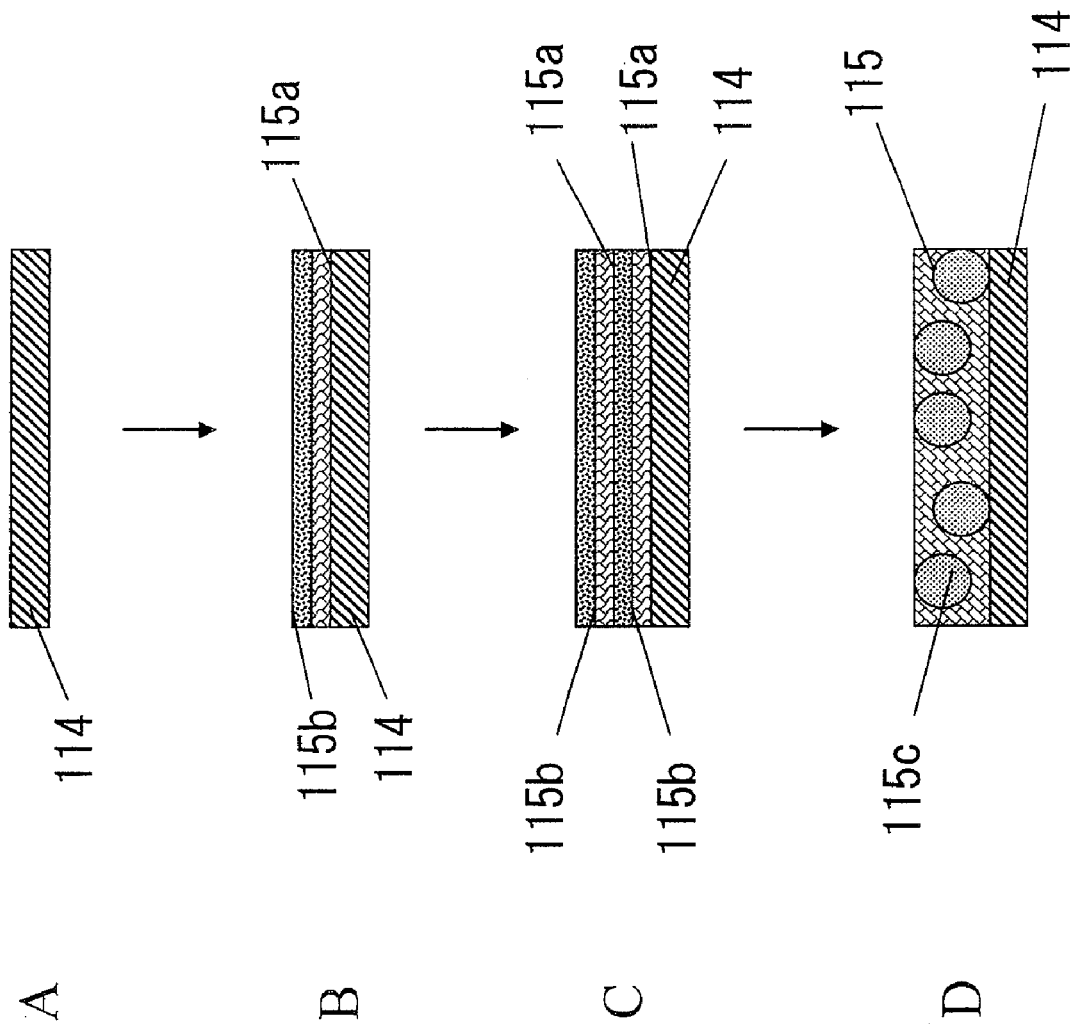
FIG. 5 is a sectional view for explaining dielectric film manufacturing processes in the manufacturing processes of the semiconductor device according to the first embodiment.

Referring to FIG. 5, strontium oxide films 115a and titanium oxide films 115b are alternately laminated by CVD to form a laminated film on the capacitor lower electrode 114 (FIGS. 5, B and C). Then, a heat treatment is applied to the laminated film to form a single-layer amorphous strontium titanate film and to simultaneously locally grow crystal grains 115c, thereby obtaining a film 115 in which the crystal grains 115c are mixed in the amorphous film (FIG. 5, D).

Figure 7:
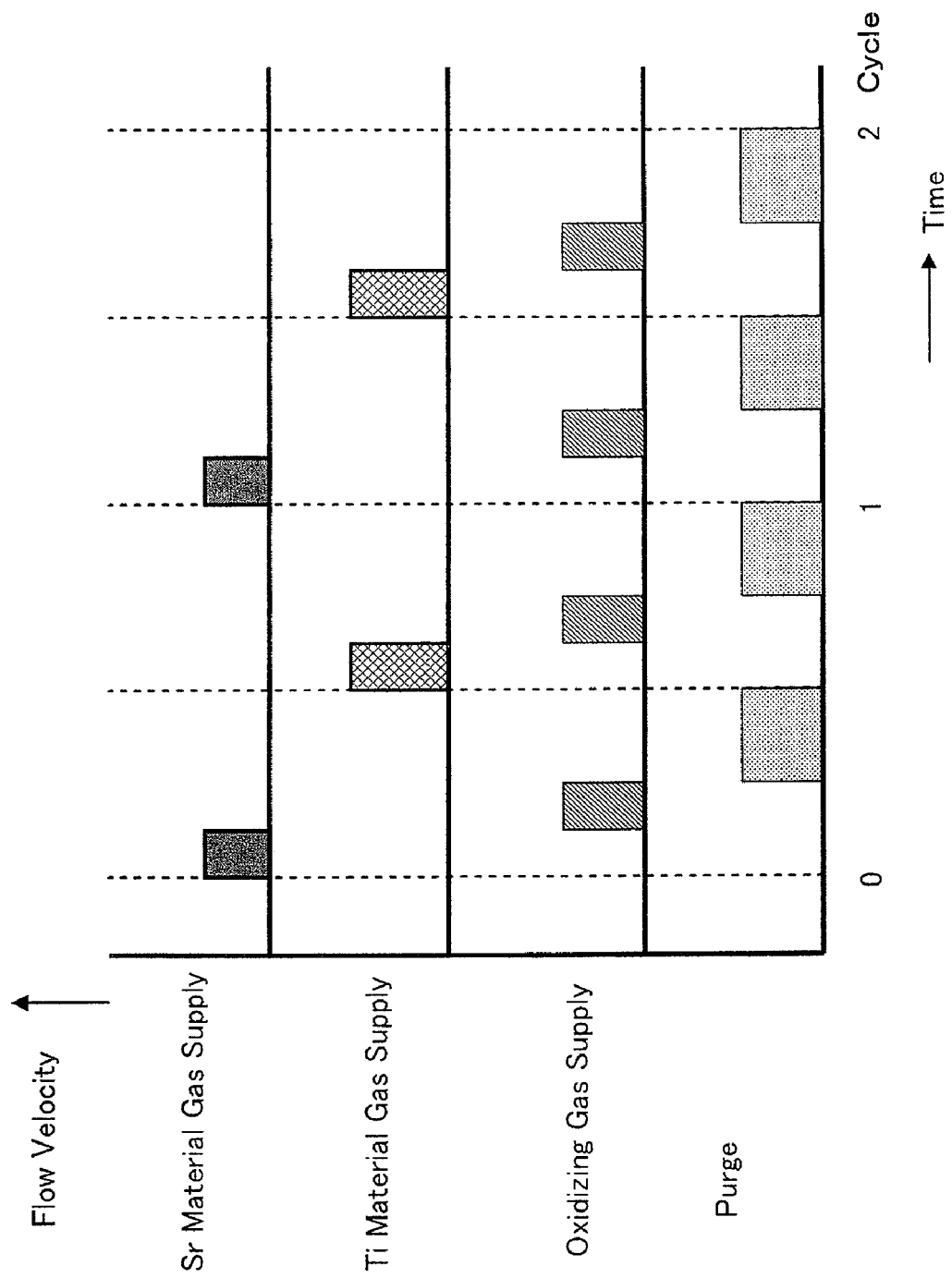
FIG. 7 is a diagram for explaining a gas supply sequence in the dielectric film manufacturing processes shown in FIG. 5.

FIG. 7 is a diagram showing the material gas supply sequence in forming the laminated film of the strontium oxide films 115a and the titanium oxide films 115b. As a Sr material gas, use is made, for example, of Sr(METHD)2: (Bis(Methoxy Ethoxy Tetramethyl Heptane Dionate)-Strontium). This is a solution dissolved in a methanol solvent and, for example, the solution has a concentration of 0.1 mol/L and is supplied at a flow velocity of 0.86 ml/min. The solution is vaporized by a vaporizer and supplied into a reaction chamber along with an Ar carrier gas. The supply time is 1 min/cycle.

As a Ti material gas, use is made, for example, of Ti(MPD)(THD)2: (Bis(Tetramethyl Heptane Dionate)-(Methyl Pentane Dioxy)-Titanium). This is also a solution dissolved in a methanol solvent and, for example, the solution has a concentration of 0.54 mol/L and is supplied at a flow velocity of 0.55 ml/min. The solution is vaporized by a vaporizer and supplied into the reaction chamber along with an Ar carrier gas. The supply time is 1 min/cycle.

As an oxidizing gas, $O_2$ (oxygen) is supplied at a flow velocity of 0.9 SLM (liters per min at standard condition (25° C., 1 atm)). The supply time is 1 min/half cycle. Instead of $O_2$ (oxygen), use can be made of $O_3$ (ozone), $N_2O$ (nitrous oxide), NO (nitrogen monoxide), $O_2$ plasma, or the like as an oxidizing gas. A $N_2$ gas is used for purge and supplied at a flow velocity of 2.0SLM. The supply time is 2 min/cycle.

The strontium oxide film 115a and the titanium oxide film 115b, i.e. the two-element films, are independently formed in order by CVD, as shown in the material gas supply sequence of FIG. 7, at a temperature, for example, at 400° C., in which crystallization does not occur, and at a pressure of 0.5 Torr, wherein each of the films 115a and 115b is formed to a thickness of preferably one to several atomic layers (FIG. 5, B). This film forming process is taken as one cycle and, by repeating this film forming process, it is possible to form a laminated dielectric film in which several amorphous strontium oxide films 115a and several amorphous titanium oxide films 115b are alternately laminated, i.e. several pairs each comprising one amorphous strontium oxide film 115a and one amorphous titanium oxide film 115b are stacked together (FIG. 5, C). In this embodiment, a laminated film having a thickness of about 5 nm is obtained by repeating the film forming process ten times, i.e. performing the film forming process for ten cycles. These film forming processes are continuously carried out without removing the semiconductor substrate from the reaction chamber.

In this embodiment, the strontium oxide film 115a is formed first. However, it is obvious that this order may be reversed, i.e. the titanium oxide film 115b is formed first and then the strontium oxide films 115a and the titanium oxide films 115b are alternately formed.

Figure 8:
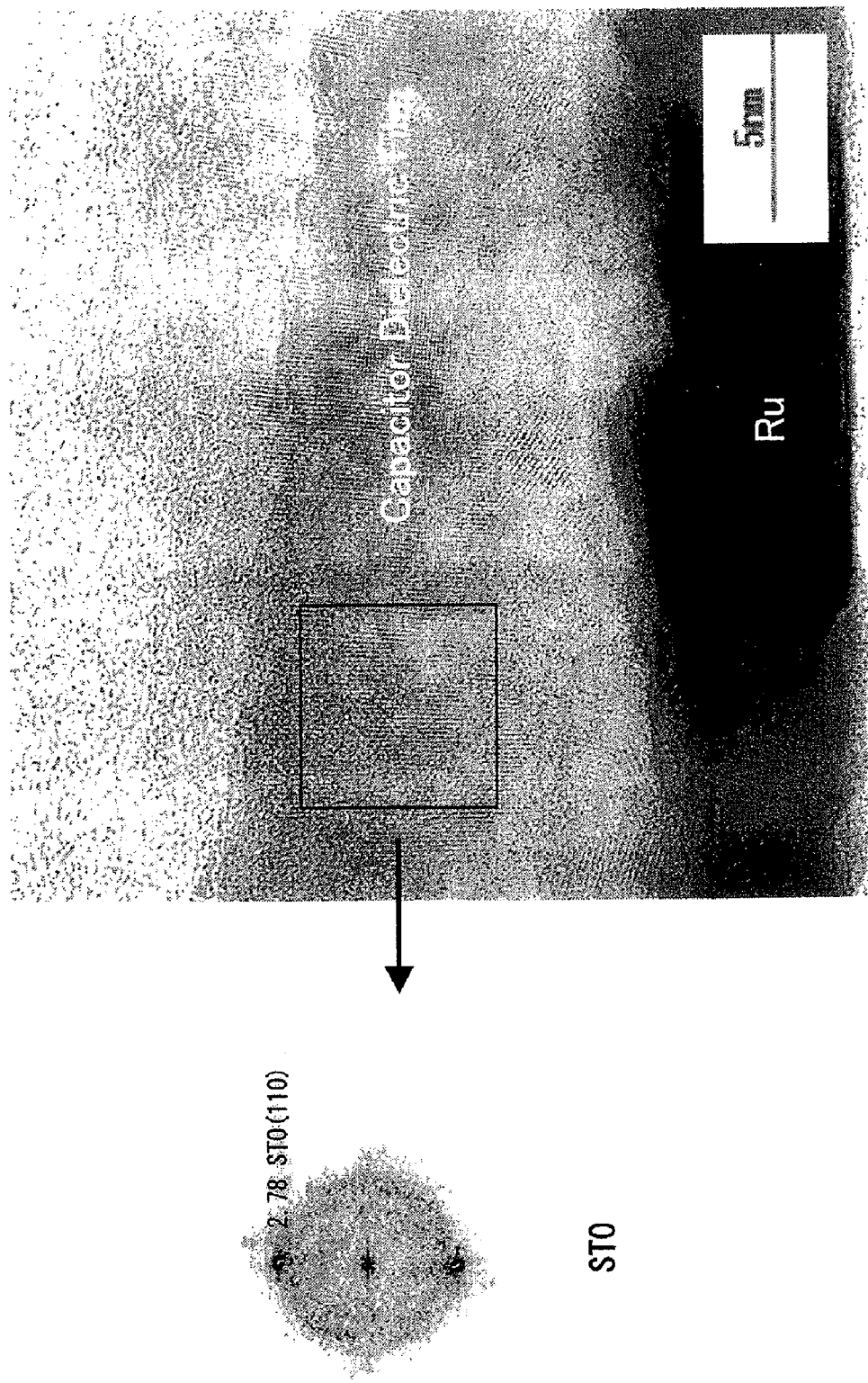
FIG. 8 is a TEM image of a dielectric film, in the form of an amorphous layer containing crystal grains, obtained in the first exemplary embodiment.

Then, a heat temperature is applied in an inert gas atmosphere at a temperature close to a critical temperature in which crystallization of the laminated film occurs. By the heat treatment, atomic rearrangement occurs so that the boundaries between the layers in the laminated film disappear and a plurality of crystal grains 115c are locally grown, and therefore, it is possible to obtain a single-layer amorphous strontium titanate film 115 having a uniform composition and covering the crystal grains 115c on the inside thereof (FIG. 5, D). In this embodiment, the heat treatment is carried out at 530° C. FIG. 8 shows a TEM image of a dielectric film formed in this embodiment, wherein the structure of the dielectric film in the form of an amorphous layer containing crystal grains is observed.

The amorphous strontium oxide film and the amorphous titanium oxide film are each deposited to a thickness of one to several atomic layers in the foregoing embodiment, but it may be deposited to a thickness of one to ten atomic layers. The number of atomic layers may be set to any value that can ensure formation of a single-layer strontium titanate film after a heat treatment.

According to the manufacturing method of this invention, a three-element film having a desired uniform composition can be formed using the two-element film forming technique, so that it is possible to easily realize the strontium titanate film 115 having a uniform composition with a molar ratio of Sr to Ti (hereinafter referred to as "Sr/Ti ratio") of 0.8 to 1.2, thereby obtaining a high relative permittivity of the dielectric film. In terms of obtaining a higher relative permittivity, the Sr/Ti ratio of the strontium titanate film is preferably 0.8 to 1.0. The desired Sr/Ti ratio is stably obtained by setting the ratio between the flow velocity of the Sr material gas and the flow velocity of the Ti material gas in the material gas supply sequence of FIG. 7. The heat-treatment temperature for obtaining the single-layer amorphous strontium titanate film 115 from the laminated film of the amorphous strontium oxide films 115a and the amorphous titanium oxide films 115b depends on the Sr/Ti ratio of the strontium titanate film and is preferably 550° C. to 600° C. when the Sr/Ti ratio is 0.8 to 1.0. When the Sr/Ti ratio is 1.0 to 1.2, the heat-treatment temperature is preferably 500° C. to 550° C. The processing temperatures in the manufacturing processes after the formation of the dielectric film are preferably lower than the foregoing heat-treatment temperature. In this manner, there is obtained the strontium titanate film with a relative permittivity of 40 to 120 and with a small leakage current.

Through the foregoing processes, the capacitor dielectric film (strontium titanate film) 115 shown in FIG. 4 is formed. Then, on the capacitor dielectric film 115 shown in FIG. 4, for example, a ruthenium film is formed as a capacitor upper electrode 116 by CVD (FIG. 1). Then, a silicon oxide film is deposited as an insulating layer 117 on the capacitor upper electrode 116 (FIG. 1) and, through a contact opening process and an interconnection (such as aluminum) layer forming process (not shown), a semiconductor device is completed.

Now, a second exemplary embodiment of this invention will be described.

The second exemplary embodiment differs from the first exemplary embodiment only in that an amorphous dielectric film such as an aluminum oxide ($AlO_x$) film is disposed between the capacitor dielectric film (strontium titanate film) 115 and the capacitor lower electrode 114 or between the capacitor dielectric film (strontium titanate film) 115 and the capacitor upper electrode 116 in the structure of FIG. 1 being the first embodiment. By inserting this film, a dielectric film with more excellent characteristics can be obtained.

Figure 6:
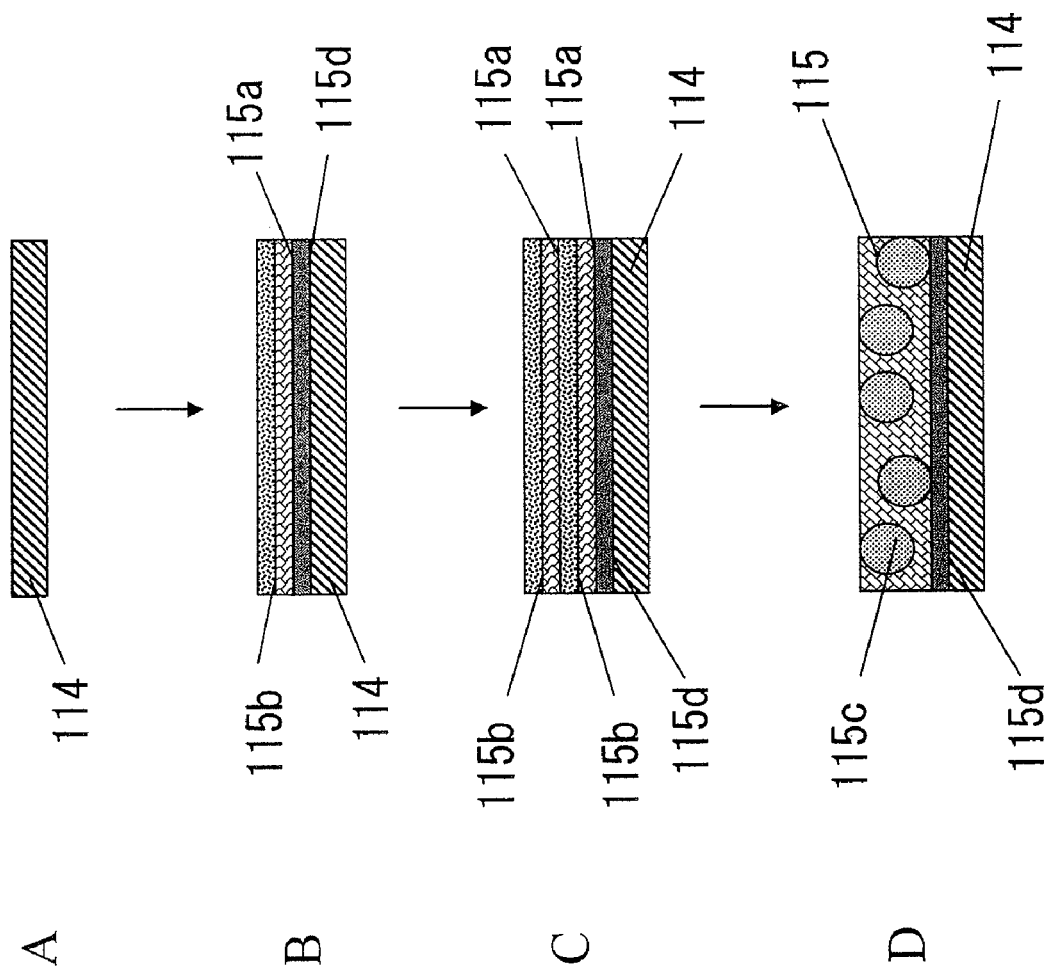
FIG. 6 is a sectional view for explaining dielectric film manufacturing processes in manufacturing processes of a semiconductor device according to a second exemplary embodiment of this invention.

FIG. 6 shows dielectric film forming processes in the second embodiment in sequence. The dielectric film forming processes of FIG. 6 are the same as the dielectric film forming processes of FIG. 5 except that an aluminum oxide ($AlO_x$) film 115d is interposed between a capacitor lower electrode 114 and a strontium titanate film 115. The aluminum oxide film 115d is formed, for example, by atomic layer deposition (ALD). Use is made, for example, of TMA (Trimethyl-Aluminum) as an Al material gas. Since the other processes are the same as those in the first exemplary embodiment, explanation thereof is omitted.

According to this invention, a three-element film exemplified, for example, by a strontium titanate film having a desired uniform composition can be formed using the technique of forming a two-element film exemplified, for example, by a strontium oxide film or a titanium oxide film, so that it is possible to stably obtain a dielectric film with a composition having a high relative permittivity. Further, by locally growing a plurality of crystal grains in an amorphous dielectric film, it is possible to form a film in which the crystal grains are mixed in the amorphous dielectric film. Since the relative permittivity of a crystalline layer is higher than that of an amorphous layer, this invention can improve the effective relative permittivity of the dielectric film by increasing the ratio of the crystalline portion to the amorphous portion. Further, this invention can suppress an increase in leakage current by reducing the probability that the crystal grain boundaries are connected between electrodes of a capacitance element to form a path for leakage current of the capacitance element.

While this invention has been described in terms of the exemplary embodiments, the invention is not to be limited thereto, but can be embodied with various changes within a range not departing from the gist of the invention and, naturally, those modifications are also included in this invention. For example, the description has been given of the laminated film of the strontium oxide film and the titanium oxide film as metal oxide films in the embodiments, but this invention is not limited thereto and other metal oxide films may be used instead of them.

What is claimed is:

1. A semiconductor device having a capacitance element including a dielectric film disposed between a first electrode layer and a second electrode layer,
wherein said dielectric film comprises a single-layer amorphous strontium titanate film covering a plurality of crystal grains wherein said amorphous strontium titanate film is a dielectric film obtained by heat-treating a laminated film comprising at least one pair of amorphous films at a temperature close to a crystallization start temperature of strontium titanate, said amorphous films being an amorphous strontium oxide film having a thickness of one to ten atomic layers and an amorphous titanium oxide film having a thickness of one to ten atomic layers, which are formed on said first electrode layer in the order named or in the reverse order.

2. The semiconductor device according to claim 1, wherein a molar ratio of strontium to titanium in said amorphous strontium titanate film is 0.8 to 1.2.

3. The semiconductor device according to claim 1, wherein a molar ratio of strontium to titanium in said amorphous strontium titanate film is 0.8 to 1.0.

4. The semiconductor device according to claim 1, wherein said laminated film comprises a plurality of pairs each including said amorphous strontium oxide film and said amorphous titanium oxide film and wherein said amorphous strontium oxide films and said amorphous titanium oxide films are alternately laminated.

5. The semiconductor device according to claim 4, wherein said amorphous strontium titanate film is formed by heat-treating said amorphous strontium oxide films and said amorphous titanium oxide films at a temperature of 500° C. to 600° C.

6. The semiconductor device according to claim 4, wherein said amorphous strontium titanate film is formed by heat-treating said amorphous strontium oxide films and said amorphous titanium oxide films at a temperature of 550° C. to 600° C.

7. The semiconductor device according to claim 1, further comprising an aluminum oxide dielectric film between one of said first and second electrode layers and said amorphous strontium titanate film.

8. The semiconductor device according to claim 1, wherein said capacitance element is included as a capacitor of a memory cell.

* * * * *